(12) United States Patent
Jeoung

(10) Patent No.: US 6,733,937 B2
(45) Date of Patent: May 11, 2004

(54) EXPOSURE METHOD FOR LIQUID CRYSTAL DISPLAY DEVICE

(75) Inventor: Hun Jeoung, Kyongsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/319,721

(22) Filed: Dec. 16, 2002

(65) Prior Publication Data
US 2003/0124443 A1 Jul. 3, 2003

(30) Foreign Application Priority Data

Dec. 27, 2001 (KR) ........................................ 2001-86064

(51) Int. Cl.$^7$ ................................................ G03F 7/22
(52) U.S. Cl. ........................ 430/30; 430/319; 430/321
(58) Field of Search ............................. 430/22, 30, 319, 430/321; 355/52, 53, 77

(56) References Cited

U.S. PATENT DOCUMENTS

2002/0146628 A1 * 10/2002 Ota .............................. 430/22

* cited by examiner

*Primary Examiner*—John A. McPherson
(74) *Attorney, Agent, or Firm*—Morgan, Lewis & Bockius LLP

(57) ABSTRACT

An exposure method for a liquid crystal display devices formed as a plurality of unit panels on a large-sized sheet of glass using a stepper includes the steps of recording benchmark measurements of the large-sized sheet of glass, determining a change in dimension of the large-sized sheet of glass prior to a stepper positioning and exposing a mask on at least one unit panel of the plurality of unit panels, and compensating for the change in dimension by changing a position of an exposure for the at least one unit panel to a position other than where the stepper had previously exposed the at least one unit panel with a first mask.

12 Claims, 8 Drawing Sheets

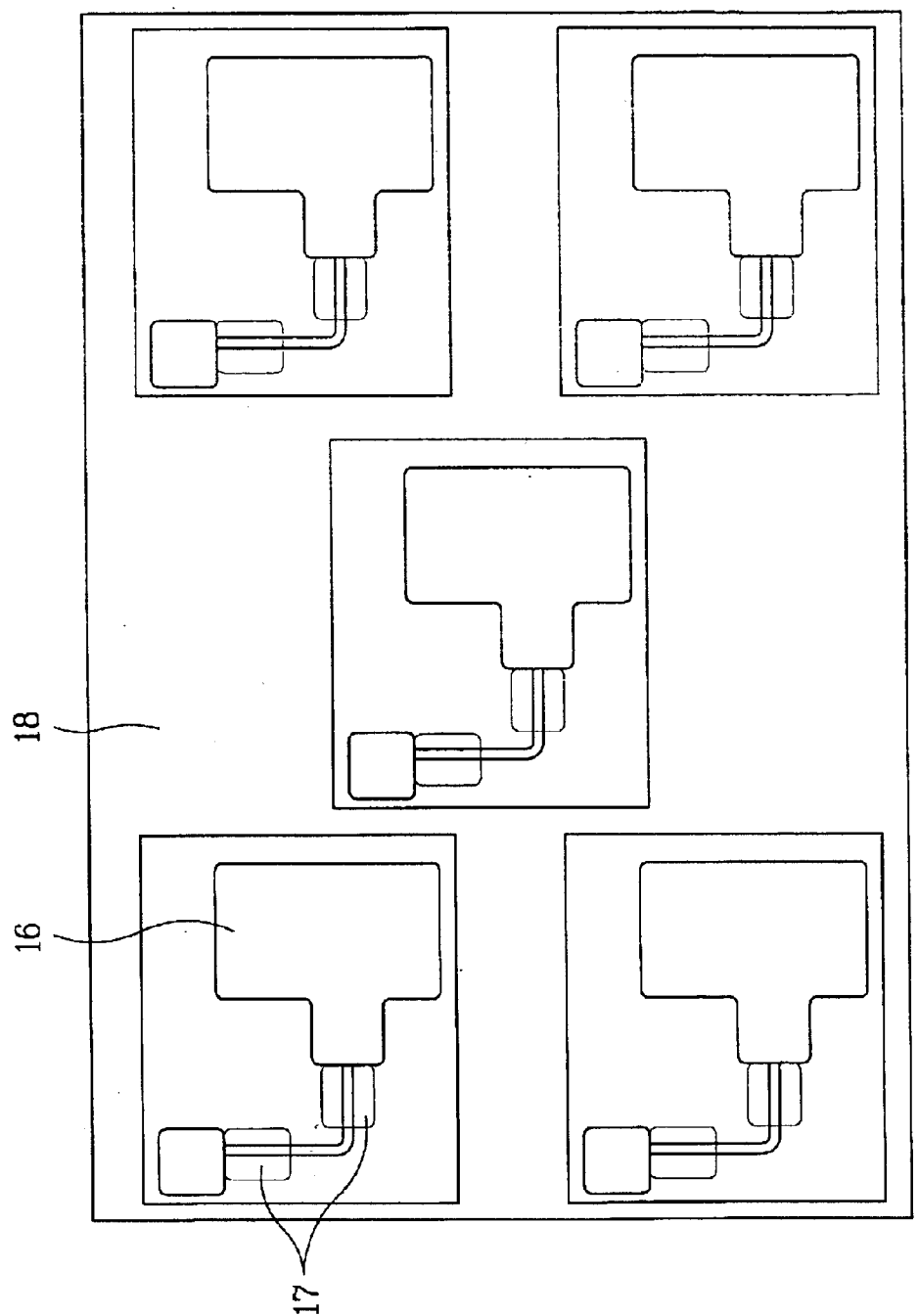

EXPOSURE METHOD FOR LIQUID CRYSTAL DISPLAY DEVICE

This application claims the benefit of the Korean Application No. P2001-86064 filed in Korea on Dec. 27, 2001, which is hereby incorporated by reference in its entirety.

BACKGROUND OF THE INVENTION

1. Field of the Invention

The present invention relates to a method of manufacturing a liquid crystal display device, and more particularly, to an exposure method for a liquid crystal display device enabling to prevent mask misalignment.

2. Discussion of the Related Art

In general, a liquid crystal display device includes lower and upper glass substrates with a liquid crystal layer therebetween. On the lower glass substrate, a plurality of gate lines is arranged in one direction to leave a predetermined interval between each other and a plurality of data lines with a predetermined interval between them is arranged in another direction perpendicular to the gate to define a plurality of matrix type pixel areas. A plurality of pixel electrodes is formed in the pixel areas, respectively. A plurality of thin film transistors is formed adjacent to intersections of the gate and data lines in the pixel areas, respectively. The thin film transistors switch signals of data lines to corresponding pixel electrodes in accordance with signals from the gate lines, respectively.

On the upper glass substrate, a black matrix layer is positioned to prevent light from transmitting through portions of the upper glass substrate except in the pixel areas defined by the black matrix layer. A color filter layer for realizing colors is positioned in the pixel areas adjacent the black matrix layer. A common electrode is formed across the entire surface of the upper glass substrate including the color filter layer and black matrix layer. A liquid crystal layer is positioned between the lower and upper glass substrates by an injection process.

Such a liquid crystal display device is manufactured by forming a plurality of unit panels on a large-sized glass substrate simultaneously. At this time, each unit panel is prepared by deposition and patterning processes. Subsequently, a bonding process is performed, and then the unit panels are cut apart.

An example of a process for fabricating a cell of a unit panel on a lower substrate is explained as follows. First, a gate line having a gate electrode is formed on the lower substrate using a gate electrode pattern mask. Typically, the lower substrate is glass. A gate insulating layer is deposited on the gate line, gate electrode and the surface of the substrate. A semiconductor layer is formed on the gate insulating layer over the gate electrode using a semiconductor layer pattern mask. A data line having a source electrode connecting to one end of the semiconductor layer is formed in a direction perpendicular to the gate line. A drain electrode is formed on the other end of the semiconductor layer and is separated from the source electrode. The source and drain electrode are formed using a source/drain electrode pattern mask. A passivation layer is then deposited on the data line, source electrode, drain electrode, semiconductor layer and the entire surface of the gate insulating layer. A contact hole is formed in the passivation layer to expose the drain electrode using a contact hole pattern mask. A pixel electrode is formed on the passivation layer. The pixel electrode connects to the drain electrode via the contact hole using a pixel electrode pattern mask.

In order to form the gate electrode, semiconductor layer, source/drain electrodes or pixel electrode for each of the cells in a unit panel, the processes of depositing a material and then patterning the material across the entire surface of the unit panel are required. Such depositing and patterning processes are either concurrently or subsequently accompanied with thermal processes. After the material is deposited on the substrate, the surface of the deposited material is cleaned. A photoresist is then coated on the surface of the deposited material. Exposure and development are carried out on the photoresist using a mask, such as the gate electrode pattern mask, to obtain the desired pattern of material. The deposited material is then etched using the patterned photoresist as a mask. Subsequently, the remaining photoresist is removed. Typically, the photoresist is a material that can be dissolved in a developing agent selectively since the molecular configuration of the photoresist is changed by a light during exposure. For example, the photoresist can be comprised of a solvent, polymer and light sensitizer.

To correctly etch the material, the mask for exposure should be aligned correctly with the substrate on which the material is deposited so that the material will have the pattern as designated by the mask at the desired location. However, the above-explained unit panels are formed simultaneously on a large-sized sheet of glass that is subsequently cut into unit panels or individual liquid crystal devices. Because of high temperatures involved in forming the thin film transistor array and the type of large-sized sheet of glass used as the lower substrate, the lower glass substrate can contracts after a high temperature process or thermal process in the process of fabricating the thin film array on the large-sized sheet of glass. The contraction can cause misalignment of masks in subsequent process steps.

As discussed above, there are at least five masks required to form the cells of a thin film transistor array with a pixel electrode on the lower glass substrate in a unit panel. Typically, a material is formed by a deposition for all of the unit panels on the large-sized sheet of glass at the same time. The material can be deposited at a high temperature or subjected to a subsequent thermal treatment process to properly form the material. Typically, a photoresist is deposited on all of the unit panels of the large-sized sheet of glass at the same time. To pattern the photoresist, a stepper is used such that the cells of a unit panel are exposed together using a single mask. The single mask is repeatedly used to sequentially expose other unit panels on the same large-sized sheet of glass. In the alternative, a single large-sized mask that has patterns for all of the unit panels can be used to pattern all of the unit panels at the same time.

The high temperature processes used in forming a deposited material allows the molecular structure of the large-sized sheet of glass to realign such that the large-sized sheet of glass contracts. Since the masks for the fabrication of each unit panel is formed for the size of a unit panel's lower substrate before the high temperature processes, the contraction causes a misalignment between the mask and the lower substrate for each unit panel on the large-sized sheet of glass. Thus, in the case of a mask for a single unit panel that is used in a stepper, the misalignment becomes pronounced as the stepper moves across the large-sized sheet of glass.

The exposure process of the liquid crystal display fabrication, in which a plurality of the panels are simultaneously manufactured on the single large-sized sheet of glass, according to the related art will be explained with reference to FIGS. 1, 2 and 3 as follows. FIG. 1 is a layout of a plurality of unit panels arranged on a large-sized sheet of glass. Referring to FIG. 1, a plurality of unit panels 1-1, 1-2, . . . , 5-4, 5-5 is arranged on a central portion of a large-sized sheet of glass 10. Alignment keys 2, 3, 4, and 5 are formed on corners of the glass substrate 10, respectively. The alignment keys 2, 3, 4, and 5 are for alignment of a stepper system (not shown) that repeatedly uses the same mask to pattern each of the unit panels. The process step of the stepper system that individually exposes a unit panel with the mask is called a shot. The stepper system, for example, exposes unit panel 1-1 in a first shot, and then moves up to expose unit panel 1-2 in a second shot and so on until the first column is complete. The rest of the columns are then similarly exposed, one after another.

Initially, the stepper system aligns on the four alignment keys 2, 3, 4 and 5 on the corners of the large-sized sheet of glass. Unfortunately, after a thermal process has been carried out at a high temperature, the glass of the large-sized sheet of glass contracts such that the distance between the alignment keys contracts. Hence, a subsequent mask for a unit panel will not be properly aligned if the stepper system again aligns to the four alignment keys 2, 3, 4 and 5 on the corners of the large-sized sheet of glass. If the exposure process for the next patterning process is carried out by aligning the stepper system with the alignment keys, misalignment will occur by a percentage corresponding to the percentage that the sheet of glass contracted.

FIG. 2 is a diagram for illustrating misalignment of a mask in a related art exposure process for manufacturing a liquid crystal display device. Typically, a stepper system starts at one corner and ends at an opposite corner. Referring to FIG. 2, when a mask of a stepper system is aligned based upon the alignment keys 2, 3 and 4 at the one corner adjacent to the alignment key 2 and an exposure process is carried out on each panel, the panel 1-1 adjacent to the alignment key 2 is properly aligned. However, misalignment increases for the unit panels as they become farther from the alignment key 2.

FIGS. 3 and 4 will be referred to in explaining how the misalignment of masks in the related art exposure process for manufacturing a liquid crystal display device progressively increases. FIG. 3 is a plan view of a first patterned material created by a related art exposure process. FIG. 4 is a plan view of a second pattern in relation to the first pattern of FIG. 3 created by the related art exposure process after the substrate was subjected to a high temperature process.

Referring to FIG. 3, a first material is deposited over each of the exemplary regions 6 on a substrate 7 formed of glass, and patterned by exposure and development into a first pattern 8. Referring to FIG. 4, a second material is deposited on the substrate 7 with a thermal process, and is patterned into a second pattern 9. When the thermal process was performed during the formation of the second pattern 9, the substrate 7 contracted. In this example, the mask alignment in the stepper is based upon the second alignment key 2 at the lower left corner. The second material is patterned in each of the exemplary regions 6 with the stepper by photolithography and etch processes that pattern the second material 9 into the shapes shown in FIG. 4. The position of the second pattern 9 near the alignment key 2 is correct. However, as the stepper proceeds in exposing exemplary regions in either the vertical or horizontal directions, the misalignment of the mask for each exemplary region 6 increases as the stepper makes exposures farther from the alignment key 2.

SUMMARY OF THE INVENTION

Accordingly, the present invention is directed to an exposure method for a liquid crystal display device that substantially obviates one or more of the problems due to limitations and disadvantages of the related art.

An object of the present invention is to provide an exposure method for a liquid crystal display device to prevent misalignment of a mask.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an exposure method for a liquid crystal display devices formed as a plurality of unit panels on a large-sized sheet of glass using a stepper includes the steps of recording benchmark measurements of the large-sized sheet of glass, determining a change in dimension of the large-sized sheet of glass prior to a stepper positioning and exposing a mask on at least one unit panel of the plurality of unit panels, and compensating for the change in dimension by changing a position of an exposure for the at least one unit panel to a position other than where the stepper had previously exposed the at least one unit panel with a first mask.

In another aspect, an exposure method for a liquid crystal display devices formed as a plurality of unit panels on a large-sized sheet of glass using a stepper includes recording benchmark measurements of the large-sized sheet of glass, taking measurements of the large-sized sheet of glass after a high temperature process on the large-sized sheet of glass, determining contraction of the large-sized sheet of glass prior to a stepper positioning and exposing a mask on at least one unit panel of the plurality of unit panels, compensating for the contraction in dimension by changing the position of an exposure for the at least one unit panel to a position other than where the stepper had previously exposed the at least one unit panel with a first mask, performing an exposure process to the at least one unit panel with a second mask in the stepper at the changed exposure position, and performing an exposure process to the at least one unit panel with a third mask in the stepper at the changed exposure position.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 is a plan view of a first pattern in relation to a second pattern on a subtrate in which the second pattern is formed according to an embodiment of the present invention after the substrate was subjected to a high temperature process.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
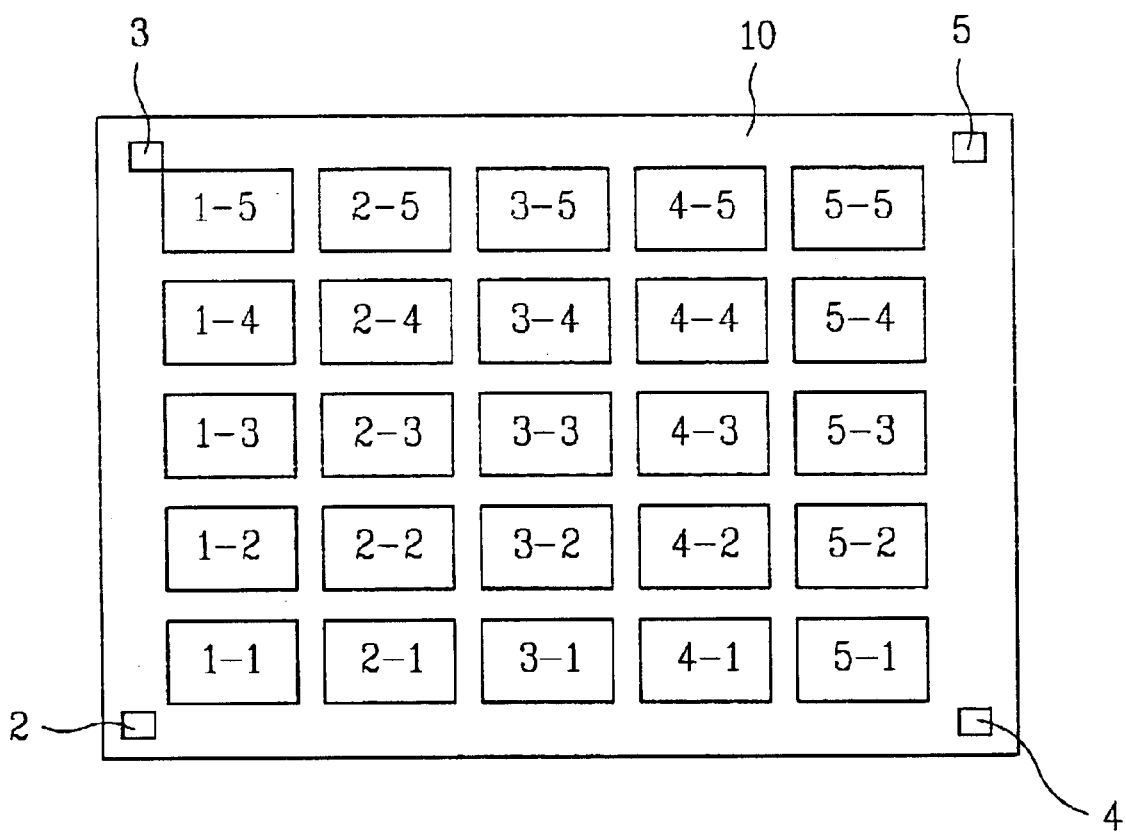
FIG. 1 is a layout of a plurality of unit panels arranged on a large-sized sheet of glass.
Figure 2:
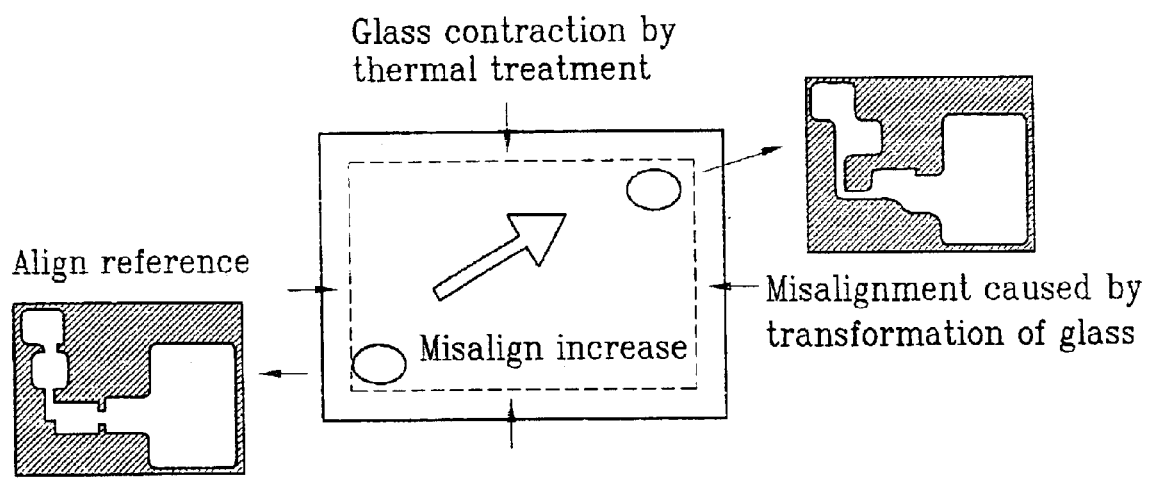
FIG. 2 is a diagram for illustrating misalignment of a mask in a related art exposure process for manufacturing a liquid crystal display device.
Figure 3:
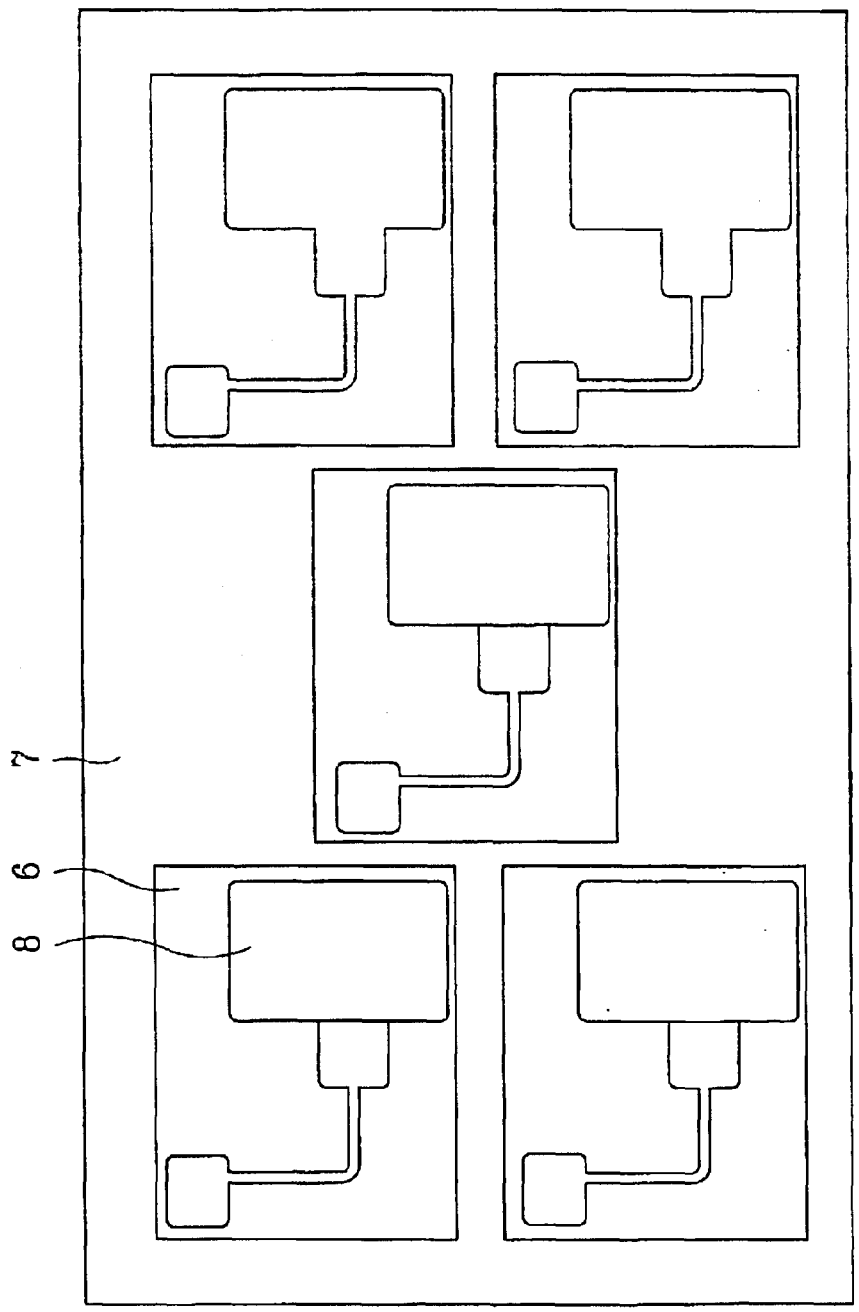
FIG. 3 is a plan view of a first pattern created by a related art exposure process.
Figure 4:
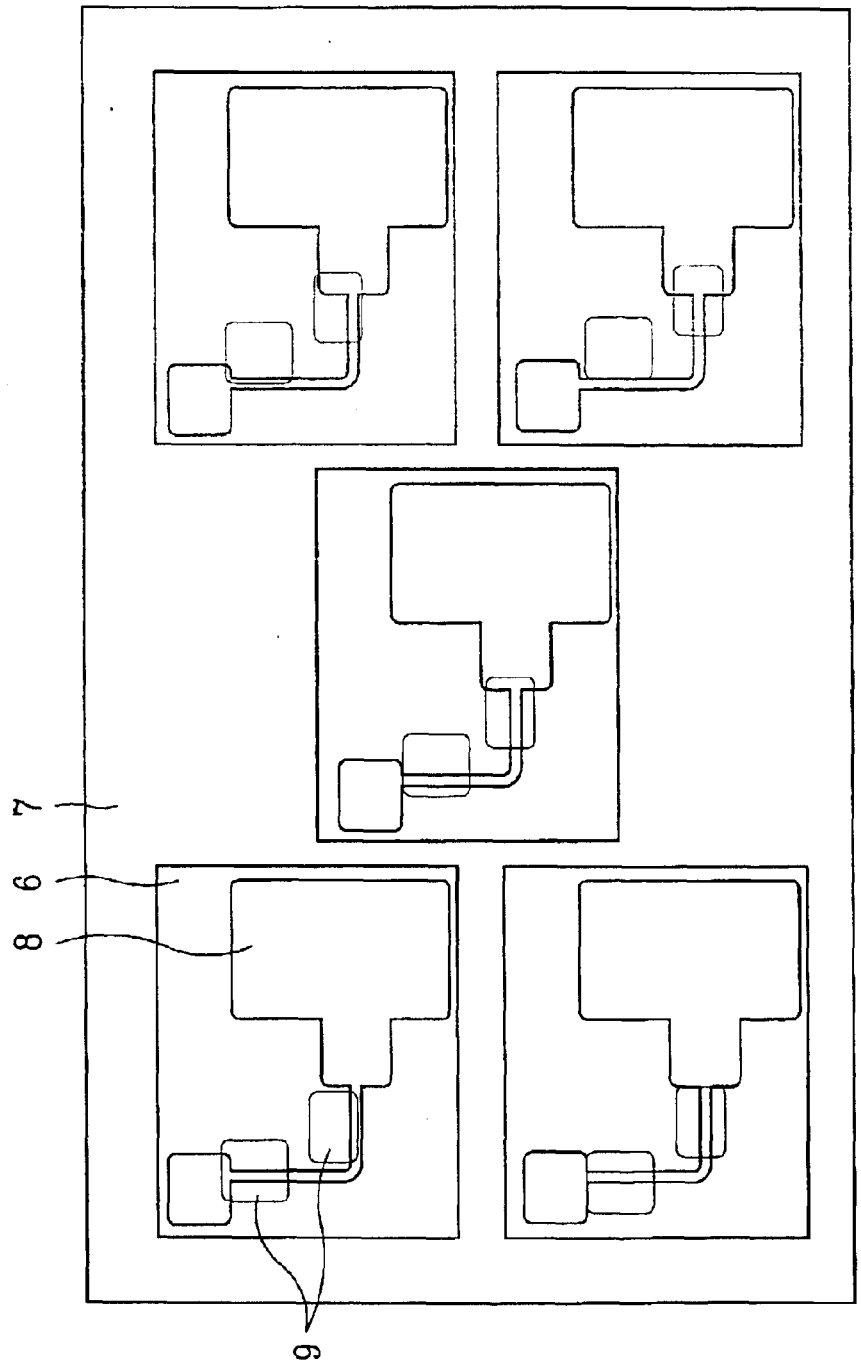
FIG. 4 is a plan view of a second pattern in relation to the first pattern of FIG. 3 created by the related art exposure process after the substrate was subjected to a high temperature process.
Figure 5:
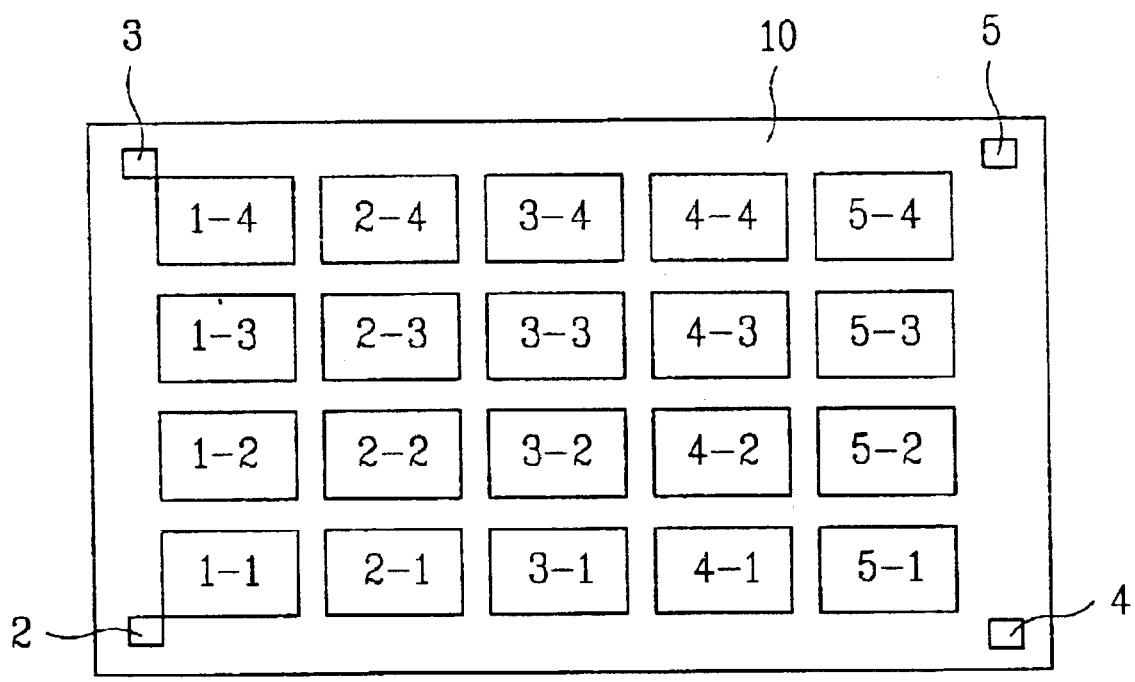
FIG. 5 is an arrangement layout for explaining an exposure method for a liquid crystal display device according to an exemplary embodiment.
Figure 6A:
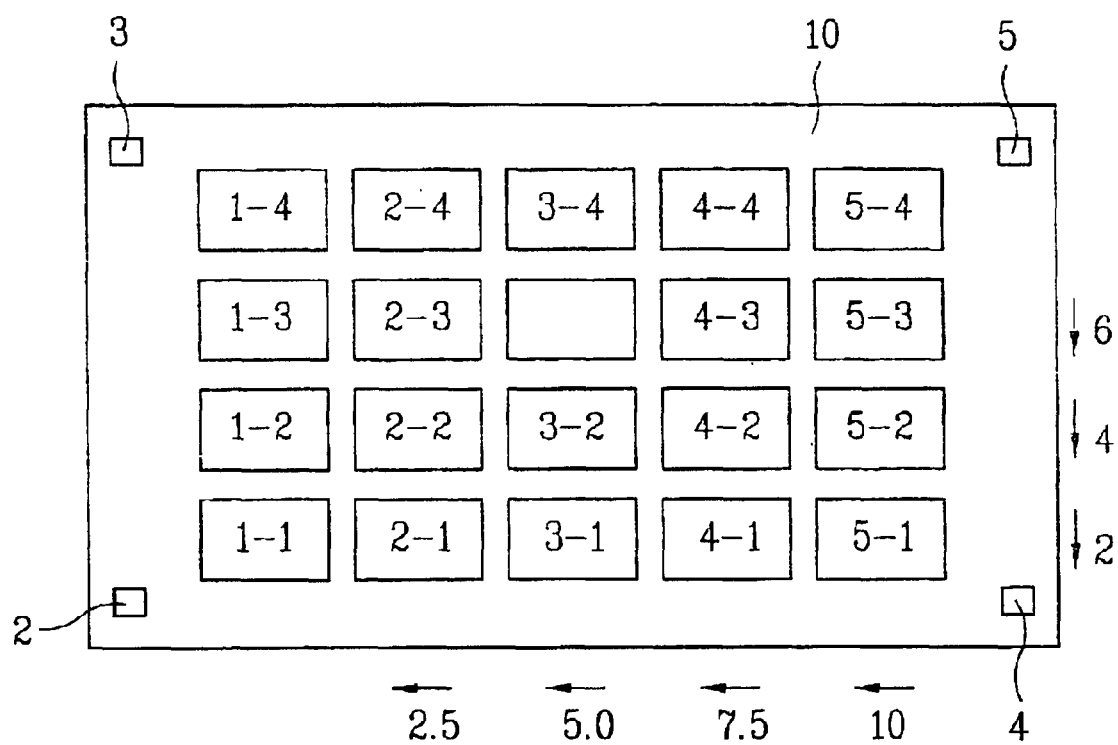
FIG. 6A is a layout illustrating the change of the exposure positions for a stepper after a thermal process contracts the large-sized sheet of glass for a plurality of unit panels according to an embodiment of the invention.

FIG. 5 is an arrangement layout for explaining an exposure method for a liquid crystal display device according to an exemplary embodiment. FIG. 6A is a layout illustrating the change of the exposure positions for a stepper after a thermal process contracts the large-sized sheet of glass for a plurality of unit panels according to an embodiment of the invention. In the exposure method of the present example, it is not required to use masks that are different than those used in the above-describes related art exposure method. The exposure method according to the present example determines the contraction or other changes in dimension of the large-sized sheet of glass prior to a stepper positioning and exposing a mask on a unit panel. The measured contraction of the large-sized sheet of glass is compensated for by changing the position of the stepper from a previous shot taken for a given unit panel to a position other than where the stepper had previously exposed the given unit panel.

Referring to FIG. 5, a plurality of unit panels 1-1, 1-2, . . . , 5-3, 5-4 is arranged on a central portion of a glass substrate 10, and alignment keys 2, 3, 4, and 5 for alignment in a liquid crystal display process are formed on corners of the large-sized sheet of glass 10, respectively. The alignment keys 2, 3, 4, and 5 are for alignment of a stepper system (not shown) that repeatedly uses the same mask to patterning each of the unit panels for a specified patterning step. Further, the stepper uses other masks corresponding to the patterning for given patterning step.

The adjustment of the position of the stepper will be explained in reference to the thin film transistor array process using the five masks of the gate electrode pattern, the semiconductor layer pattern, the source/drain electrode pattern, the contact hole pattern, and the pixel electrode pattern. First, benchmark measurements of the large-sized sheet of glass 10 in terms of length and width are recorded for the large-sized sheet of glass 10. The metal for the gate electrode is deposited on an entire surface of the large-sized sheet of glass 10 by sputtering, and a photoresist is deposited thereon. The photoresist is exposed using a stepper with a gate electrode pattern mask. At this time, the large-sized sheet of glass 10 is not contracted or has not changed in dimension since the gate electrode is deposited on the plurality of unit panels 1-1, 1-2, . . . , 5-3, 5-4 by sputtering at a low temperature.

The large-sized sheet of glass 10 is contracted just prior to patterning of the semiconductor layer since amorphous silicon is deposited on the plurality of unit panels 1-1, 1-2, . . . , 5-3, 5-4, and then crystallized into a polysilicon with a high temperature process. After the high temperature process is carried out on the plurality of unit panels 1-1, 1-2, . . . , 5-3, 5-4 on the large-sized sheet of glass 10 but prior to the subsequent semiconductor layer pattern mask exposure, contraction measurements of the large-sized sheet of glass 10 are taken and a change in dimension, such as contraction, is determined for the large-sized sheet of glass relative to the benchmark measurements of the large-sized sheet of glass 10. In other words, the length and width of the large-sized sheet of glass 10 after a high temperature process are measured and respectively subtracted from the benchmark length and width measurements to obtain the respective length and width changes. Then, the position of the stepper is changed from a previous shot taken for each given unit panel, other than a unit panel on a side to which the stepper is initially aligned, such that the contraction of the large-sized sheet of glass 10 is taken into consideration.

The change of the exposure position in the horizontal direction for a given unit panel, other than a unit panel on a vertical side to which the stepper is aligned, is determined by dividing the horizontal contraction by a number that is one less than the number of unit panels in the horizontal direction on the large-sized sheet of glass 10 and multiplying that by the position integer value of the column from the vertical side to which the stepper is aligned for the given unit panel, which is reduce by one. The change of the exposure position in the vertical direction for a given unit panel, other than a unit panel on a horizontal side to which the stepper is aligned, is determined by dividing the vertical contraction by a number that is one less than the number of unit panels in the vertical direction on the large-sized sheet of glass 10 and multiplying that by the position integer value of the column from the horizontal side to which the stepper is aligned for the given unit panel, which is reduce by one. For example, if the horizontal contraction of the large-sized glass substrate is about 10 μm after the thermal processing of the amorphous silicon, the exposure position of the stepper is shifted 2.5 μm toward the vertical side to which the stepper is aligned for the second column since (10 μm/(5 columns−1))×(column#2−1)=2.5 μm. The third, fourth and fifth columns are respectively shifted 5, 7.5 and 10 μm. In addition, if the vertical contraction of the large-sized glass substrate is about 6 μm after the thermal processing of the amorphous silicon, the exposure position of the stepper is shifted 2 μm toward the horizontal side to which the stepper is aligned for the second row since (6 μm/(4 rows−1))×(row #2−1)=2 μm. The third and fourth rows are respectively shifted 4 μm and 6 μm.

As shown in FIG. 6A, the exposure process for the semiconductor layer pattern is carried out on the unit panel 1-1 without any change of the exposure position since the unit panel 1-1 is on both the horizontal side, which is the side having alignment markers 2 and 4, and the vertical side, which is the side having alignment markers 2 and 3, to which the stepper is aligned. Subsequently, the exposure process for the semiconductor layer patter is carried out on the next unit panel 1-2 after changing the previous exposure position for the gate electrode pattern mask on the unit panel by shifting 2 μm toward the horizontal side to which the stepper is aligned using the above described equation. The exposure processes for unit panels 1-3 are 1-4 are then similar performed with respect to their previous exposure positions using the above-described equation for the gate electrode pattern mask.

As explained above, the unit panels 1-1, 1-2, 1-3 and 1-4 in a first column are exposed. Then, the second column of unit panels 2-1, 2-2, 2-3 and 2-4 are exposed. The exposure position for the unit panel 2-1 is changed from the previous exposure position for the gate electrode pattern mask on the unit panel 2-1 by shifting 2.5 μm toward the vertical side to which the stepper was initially aligned using the above described equation. The exposure processes later in the exposure sequence for unit panels 3-1, 4-1 and 5-1 are similarly performed with respect to their previous exposure position using the above described equations for the gate electrode pattern mask.

The exposure position for the unit panel 2-2 is changed from the previous exposure position for the gate electrode pattern mask on the unit panel 2-2 by shifting 2.5 μm toward the vertical side to which the stepper is aligned and 2 μm toward the horizontal side to which the stepper is aligned using the above described equations. The exposure processes for unit panels 2-3 and 2-4 are then similarly performed with respect to their previous exposure position for the gate electrode pattern mask using the above described equations. Further, the exposure processes later in the exposure sequence for unit panels 3-2, 3-3, 3-4, 4-2, 4-3, 4-4, 5-2, 5-3 and 5-4 are similarly performed with respect to their previous exposure position for the gate electrode pattern mask using the above described equations. Subsequently exposed masks are exposed in with the same changed exposure positions for the unit panels, except the one at the lower left corner that is not changed, until the process is ended or another higher temperature process occurs that changes the dimension of the large-sized sheet of glass.

Figure 6B:
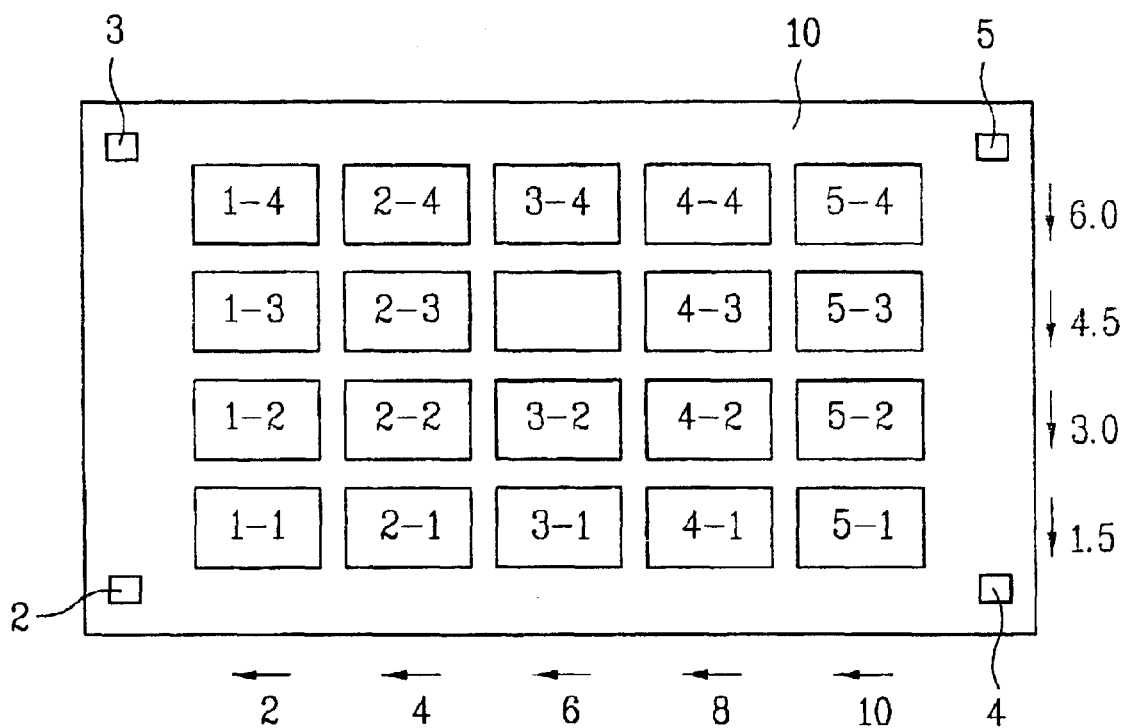
FIG. 6B is a layout illustrating the change of the exposure positions for a stepper after a thermal process contracts the large-sized sheet of glass for a plurality of unit panels according to another embodiment of the invention.

In the above embodiment, the change of the exposure positions assumes that the sides are relatively fixed. In the alternative, each unit panel can have a change in exposure position determined by dividing the horizontal contraction by the number of columns and then multiplying that by the position integer value of the column that a unit panel is within. Likewise, each unit panel can have a change in exposure position determined by dividing the vertical contraction by the number of rows and then multiplying that by the position integer value of the row that the unit panel is within. FIG. 6B is a layout illustrating the change of each exposure position for a stepper after a thermal process contracts the large-sized sheet of glass for a plurality of unit panels according to another embodiment of the invention.

Referring to FIG. 6B, if the horizontal contraction of the large-sized glass substrate is about 10 μm after the thermal processing of the amorphous silicon, the exposure position of the stepper is shifted 2 μm for the first column toward the vertical side to which the stepper is aligned initially since (10 μm/((5 columns)×(column#))) for the first column equals 2 μm. The change for the exposure positions of the unit panels in the second, third, fourth and fifth columns are 4 μm, 6 μm, 8 μm and 10 μm, respectively. In addition, if the vertical contraction of the large-sized glass substrate is about 6 μm after the thermal processing of the amorphous silicon, the exposure position of the stepper is shifted 1.5 μm for the first row toward the horizontal side to which the stepper is aligned initially since (6 μm/((4 rows)×(row#))) for the first row equals 1.5 μm. The change for the exposure positions of the unit panels in second, third and fourth rows are 3 μm, 4.5 μm and 6 μm, respectively. This embodiment of the present invention requires that all of the unit panels have a change in exposure positions if the large-sized sheet of glass contracts in either the vertical or horizontal directions. Subsequently exposed masks are exposed in the same changed exposure positions for each unit panel until the process is ended or another higher temperature process occurs that further changes the dimension of the large-sized sheet of glass.

FIG. 7 is a plan view of a first pattern 16 in relation to a second pattern 17 on a substrate in which the second pattern 17 is formed according to an embodiment of the present invention after the substrate 18 was subjected to a high temperature process. Accordingly, it is possible to pattern the semiconductor layer, source/drain, contact hole and pixel electrode on the glass substrate using either one of the above disclosed embodiments without misalignment between the glass substrate and the mask by changing most or all of the exposure positions of the masks to compensate for contraction of a large-sized sheet of glass.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An exposure method for a liquid crystal display devices formed as a plurality of unit panels on a large-sized sheet of glass using a stepper, comprising the steps of:

recording benchmark measurements of the large-sized sheet of glass;

determining a change in dimension of the large-sized sheet of glass prior to a stepper positioning and exposing a mask on at least one unit panel of the plurality of unit panels;

compensating for the change in dimension by changing a position of an exposure for the at least one unit panel to a position other than where the stepper had previously exposed the at least one unit panel with a first mask; and taking measurements of the large-sized sheet of glass after a high temperature process on the large-sized sheet of glass.

2. The exposure method of claim 1, further comprising the step of performing an exposure process to the at least one unit panel with a mask in the stepper at the changed exposure position.

3. The exposure method of claim 1, wherein the at least one unit panel is other than a unit panel on a vertical side of the large-sized substrate to which the stepper is aligned and the amount of horizontal change of the exposure position in a horizontal direction for the at least one unit panel is determined by dividing a change in dimension in a horizontal direction by a number that is one less than the number of unit panels in the horizontal direction on the large-sized sheet of glass and multiplying that by the position integer value of the column from the vertical side to which the stepper is align for the given unit panel, which is reduce by one.

4. The exposure method of claim 1, wherein the at least one unit panel is other than a unit panel on a horizontal side of the large-sized substrate to which the stepper is aligned and the amount of vertical change of the exposure position in a vertical direction for the at least one unit panel is determined by dividing a change in dimension in a vertical direction by a number that is one less than the number of unit panels in the vertical direction on the large-sized sheet of glass and multiplying that by the position integer value of the row from the horizontal side to which the stepper is align for the given unit panel, which is reduce by one.

5. The exposure method of claim 1, wherein each unit panel of the plurality of unit panels has a change in exposure position determined by dividing a horizontal change in dimension by a number of columns and then multiplying that by a position integer value of a column that a unit panel is within.

6. The exposure method of claim 1, wherein each unit panel of the plurality of unit panels has a change in exposure position determined by dividing a vertical change in dimension by a number of rows and then multiplying that by a position integer value of a row that a unit panel is within.

7. The exposure method of claim 1, further comprising the steps of:

performing an exposure process to the at least one unit panel with a second mask in the stepper at the changed exposure position; and performing an exposure process to the at least one unit panel with a third mask in the stepper at the changed exposure position.

8. An exposure method for a liquid crystal display devices formed as a plurality of unit panels on a large-sized sheet of glass using a stepper, comprising the steps of:

recording benchmark measurements of the large-sized sheet of glass;

taking measurements of the large-sized sheet of glass after a high temperature process on the large-sized sheet of glass;

determining contraction of the large-sized sheet of glass prior to a stepper positioning and exposing a mask on at least one unit panel of the plurality of unit panels;

compensating for the contraction by changing the position of an exposure for the at least one unit panel to a position other than where the stepper had previously exposed the at least one unit panel with a first mask;

performing an exposure process to the at least one unit panel with a second mask in the stepper at the changed exposure position; and performing an exposure process to the at least one unit panel with a third mask in the stepper at the changed exposure position.

9. The exposure method of claim 8, wherein the at least one unit panel is other than a unit panel on a vertical side of the large-sized substrate to which the stepper is aligned and the amount of horizontal change of the exposure position in a horizontal direction for the at least one unit panel is determined by dividing a contraction in a horizontal direction by a number that is one less than the number of unit panels in the horizontal direction on the large-sized sheet of glass and multiplying that by the position integer value of the column from the vertical side to which the stepper is align for the given unit panel, which is reduce by one.

10. The exposure method of claim 8, wherein the at least one unit panel is other than a unit panel on a horizontal side of the large-sized substrate to which the stepper is aligned and the amount of vertical change of the exposure position in a vertical direction for the at least one unit panel is determined by dividing a contraction in a vertical direction by a number that is one less than the number of unit panels in the vertical direction on the large-sized sheet of glass and multiplying that by the position integer value of the row from the horizontal side to which the stepper is align for the given unit panel, which is reduce by one.

11. The exposure method of claim 8, wherein each unit panel of the plurality of unit panels has a change in exposure position determined by dividing a horizontal contraction by a number of columns and then multiplying that by a position integer value of a column that a unit panel is within.

12. The exposure method of claim 8, wherein each unit panel of the plurality of unit panels has a change in exposure position determined by dividing a vertical contraction by a number of rows and then multiplying that by a position integer value of a row that a unit panel is within.

* * * * *